US006893069B1

(12) United States Patent  (10) Patent No.: US 6,893,069 B1
Graham  (45) Date of Patent: May 17, 2005

(54) DIE EDGE-PICKING VACUUM TOOL

(75) Inventor: Jason S. Graham, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 60 days.

(21) Appl. No.: 10/195,771

(22) Filed: Jul. 12, 2002

Related U.S. Application Data

(60) Provisional application No. 60/305,921, filed on Jul. 16, 2001.

(51) Int. Cl.[7] .............................................. B25J 15/06
(52) U.S. Cl. ..................................... 294/64.1; 414/941
(58) Field of Search .............................. 294/64.1, 64.2, 294/64.3, 65; 414/627, 737, 752.1, 941; 901/40; 29/743, 758; 15/415.1, 416, 420, 414

(56) References Cited

U.S. PATENT DOCUMENTS

| | | | | |
|---|---|---|---|---|
| 3,873,144 | A | * | 3/1975 | Diepeveen ................... 294/64.1 |
| 5,169,196 | A | | 12/1992 | Safabakhsh ................. 294/64.3 |
| 5,292,222 | A | * | 3/1994 | Malagrino et al. ........... 414/815 |
| 5,347,679 | A | * | 9/1994 | Saunders et al. .............. 15/416 |
| 5,588,203 | A | * | 12/1996 | Bidefeld ........................ 29/743 |
| 5,727,832 | A | * | 3/1998 | Holter ......................... 294/64.1 |
| 5,765,890 | A | * | 6/1998 | Gaylord et al. ................ 294/65 |
| 6,024,631 | A | | 2/2000 | Piper ............................. 451/41 |
| 6,322,116 | B1 | * | 11/2001 | Stevens ...................... 294/64.3 |

FOREIGN PATENT DOCUMENTS

| | | | |
|---|---|---|---|
| JP | 63-130536 | * | 6/1987 |
| JP | 6-53306 | * | 2/1994 |
| SU | 499203 | * | 1/1976 |

* cited by examiner

Primary Examiner—Dean J. Kramer
(74) Attorney, Agent, or Firm—William C. Schubert; Karl A. Vick

(57) ABSTRACT

A tool (10) for vacuum-holding an object, such as an integrated circuit die (20). The tool includes a body portion (16) having a vacuum outlet (16A) for being coupled to a vacuum source. The body portion is coupled to a plurality of tool leg portions (14A, 14B) each having an edge that defines a mating surface (15) for engaging an edge (20A, 20B) of the object. Each mating surface contains at least one vacuum inlet (12) in fluid communication with the vacuum outlet. In one preferred embodiment there are two leg portions providing two mating surfaces that meet at a corner, where the corner defines a 90 degree angle and corresponds to a corner of the integrated circuit die. A corner relief (15A) may be provided to ensure a good mating seal with the die edges. A gasket (18) can be provided to surround the at least one vacuum inlet for ensuring the quality of the vacuum seal. The vacuum inlet is formed by an opening having dimensions that are, preferably but not by way of limitation, less than dimensions of the edge of the die. For example, the vacuum inlet is formed by an elongated slot that has dimensions that are less than the dimensions of the edge of the die. The vacuum-picking tool can be used in a manual or an automated environment. For use the manual environment, the vacuum outlet can be adapted to be coupled to a hand-held tool (30) that is interposed between the vacuum outlet and the vacuum source.

15 Claims, 4 Drawing Sheets

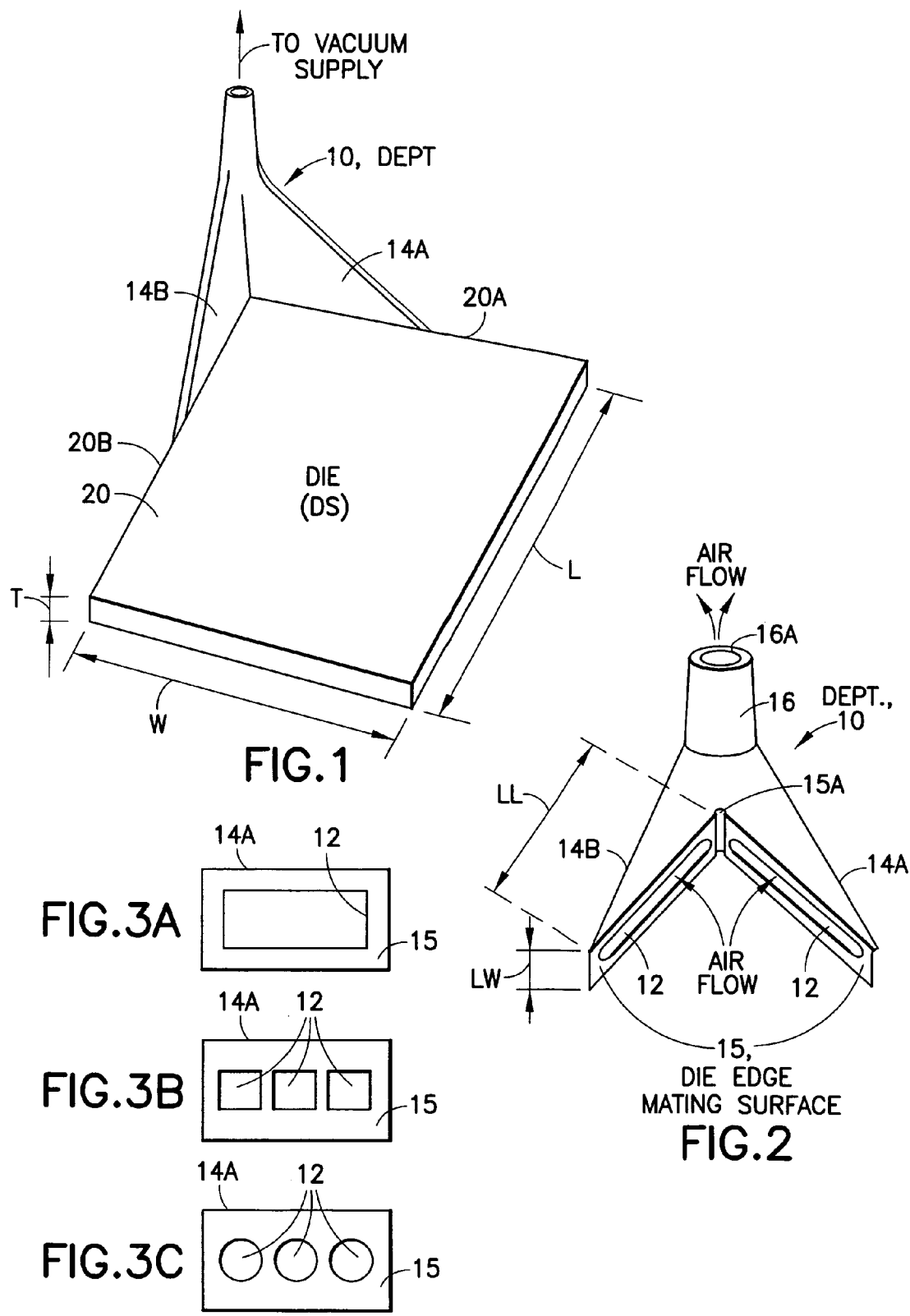

DIE EDGE-PICKING VACUUM TOOL

This U.S. Patent Application claims priority under 35 U.S.C. 119(e) from Provisional Patent Application No. 60/305,921, filed Jul. 16, 2001, incorporated by reference herein in its entirety.

TECHNICAL FIELD

The teachings of this invention relate generally to vacuum-based tools for lifting and manipulating objects, and more specifically relate to semiconductor circuit die handling tools and methods and, even more specifically, relate to vacuum holding tools for semiconductor die.

BACKGROUND

It is a requirement to individually handle individual integrated circuit die after they have been separated from a wafer. This process is often referred to as die picking. A problem exists, however, as it is typically undesirable to physically contact the top, circuitry containing surface of the die, as damage may result to the delicate and critical top surface features.

In U.S. Pat. No. 6,024,631, issued Feb. 15, 2000, entitled "Method and Apparatus to Hold Integrated Circuit Chips onto a Chuck and to Simultaneously Remove Multiple Integrated Circuit Chips from a Cutting Chuck", Piper discloses a cutting chuck used with a cutting blade for holding a semiconductor wafer in place during a dicing process. Piper also discloses a die pick for picking the segmented semiconductor wafer from the chuck. The die pick includes a pick head having a surface for contacting the plurality of die sawn from a wafer. The surface includes a plurality of ports that are in fluid communication with a vacuum source, and the die pick simultaneously picks the plurality of die from the chuck for further processing.

The technique of Piper is one that is exemplary of the prior art die pickers that require contact to the top surface of the die.

In U.S. Pat. No. 5,169,196, issued Dec. 8, 1992, entitled "Non-Contact Pick-Up Head", Safabakhsh discloses a pick-up tool or pick-up head for picking up semiconductor objects. An active face of the pick-up tool is provided with an outer plenum that extends around the peripheral edges of the object to be picked up and further includes an inner plenum formed in the center of the pick-up tool over the object to be picked up. A partial vacuum is applied to the inner plenum and compressed air is supplied to the outer plenum. The compressed air flows over a support ridge separating the inner plenum from the outer plenum. The air flowing over the ridge generates a thin air film supporting layer so that the object being picked up by the pick-up tool is supported on the air film and levitated separate and apart from the pick-up tool.

As can be appreciated, the pick-up tool of Safabakhsh has a complicated construction, and furthermore requires both a source of compressed air and a partial vacuum source for operation.

SUMMARY

The foregoing and other problems are overcome by methods and apparatus in accordance with embodiments of this invention.

This invention fulfills the need for a device that can pick up a semiconductor circuit die from the edges of the die, and thus avoids the problems inherent in top-surface picking devices due to the delicate and critical top surface features of the die.

Disclosed herein is a tool for vacuum-holding an object, such as an integrated circuit die. The tool includes a body portion having a vacuum outlet for being coupled to a vacuum source. The body portion is coupled to a plurality of tool leg portions each comprising an edge that defines a mating surface for engaging an edge of the object. Each mating surface contains at least one vacuum inlet in fluid communication with the vacuum outlet. In one preferred embodiment there are two leg portions providing two mating surfaces that meet at a corner, where the corner defines a 90 degree angle and corresponds to a corner of the integrated circuit die. It is preferred, but not required, that a corner relief be provided so that the corner of the die will fully fit within the corner of the tool without obstruction. A gasket can be provided to surround the at least one vacuum inlet for ensuring the quality of the vacuum seal. The vacuum inlet is formed by an opening having dimensions that are less than dimensions of the edge of the die. For example, the vacuum inlet is formed by an elongated slot having dimensions, in the preferred embodiment, that are less than the dimensions of the edge of the die. The dimensions of the vacuum inlet are not, however, limited to being less than the dimensions of the die edge, as some vacuum leakage may be tolerated depending on the die mass and size. The vacuum-picking tool can be used in a manual or an automated environment. For use the manual environment, the vacuum outlet can be adapted to be coupled to a hand-held tool that is interposed between the vacuum outlet and the vacuum source.

A method of this invention for picking a semiconductor circuit die that is disposed on a surface includes engaging the die at a corner thereof with a vacuum-picking tool; applying a vacuum holding force from the tool only along edges of the die that meet at the corner; and lifting the die from the surface with the tool without intentionally contacting a top surface of the die.

BRIEF DESCRIPTION OF THE DRAWINGS

The above set forth and other features of these teachings are made more apparent in the ensuing Detailed Description of the Preferred Embodiments when read in conjunction with the attached Drawings, wherein:

FIG. 1 is an elevational view showing an embodiment of a die edge picking tool in accordance with this invention when vacuum-mated to the edges of an integrated circuit die;

FIG. 2 is an elevational view showing the embodiment of the die edge picking tool of FIG. 1, and further illustrating the location of vacuum openings along die edge engaging surfaces of two legs;

FIGS. 3A, 3B and 3C show non-limiting examples of alternate shapes for and embodiments of the vacuum openings shown in FIG. 2;

DETAILED DESCRIPTION OF THE PREFERRED EMBODIMENTS

Figure 4:
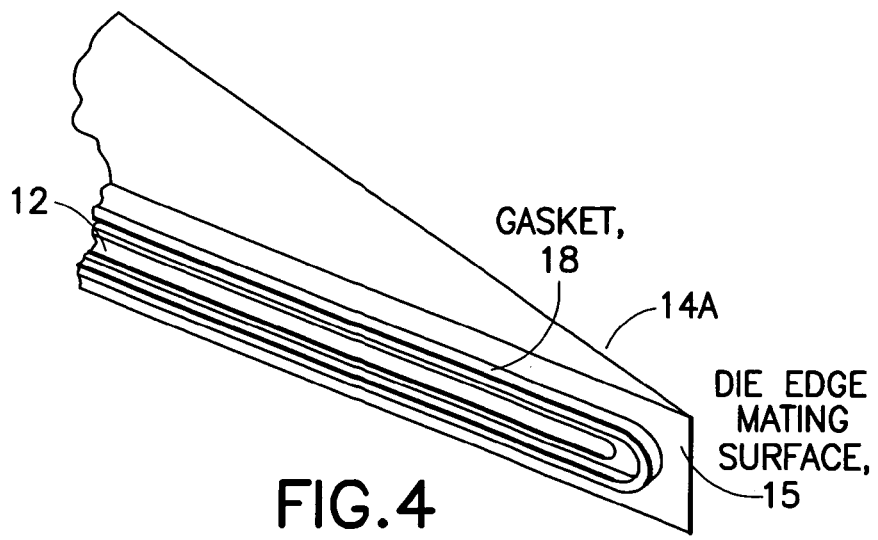
FIG. 4 is a partial view of one of the legs of FIG. 2, and shows the location of an embodiment of an optional sealing gasket.

Referring to FIG. 1, a die picking tool 10 in accordance with an embodiment of this invention is shown engaging or grasping or holding a die 20 along two adjoining edges 20A and 20B of the die. Referring also to FIG. 2, the tool 10, also referred to herein as a die edge picking tip or tool (DEPT), incorporates a slot or opening 12 on die edge mating surfaces 15 of each of two legs 14A and 14B where a vacuum supply is flowed through. The opening 12 may be referred to as a vacuum inlet. The vacuum supply is provided from a conventional vacuum source (not shown) through a conduit 16A made within a body portion 16 of the die edge picking tool 10 from which the legs 14A, 14B extend. The conduit 16A, which may be referred to as a vacuum outlet, is in fluid communication with the openings 12 through a vacuum passage or chamber (not shown) located within the body portion 16. When the die edge mating surfaces 15 are mated to the edges 20A and 20B of the die 20, the die edge picking tool 10 creates a vacuum picking force.

In other embodiments the die edge picking tool 10 may include just one leg, depending on the requirement of the application. However, if at least the two legs 14A and 14B are then at least twice the picking force is obtained, and in addition at least some of a cantilever effect present using just one leg is avoided. This cantilever effect results from the force of gravity acting on the die 20 and tending to cause a downward rotation around the die edge that is held by the leg of the die edge picking tool 10.

In general, it is assumed for most cases that the object to be held by the tool 10 will have opposing first and second major surfaces that are surrounded by an edge or edges having a width defined by the thickness of the object, where the width is substantially smaller than a largest dimension of the opposed major surfaces. In the embodiment of FIG. 1 the die 20 has a circuit-containing surface, referred to for convenience as the top surface (TS), an opposed bottom surface (not shown) having, in this non-limiting case, substantially the same dimensions as the top surface, as well as four edge surfaces whose width is substantially less than the dimensions of the top and bottom surfaces, and where the edge surfaces are perpendicular to the top and bottom surfaces. Two of the edge surfaces (20A, 20B) are the surfaces by which the die edge picking tool 10 vacuum-holds the die 20. In other embodiments there may be different dimensional and angular relationships between the surfaces of the object. However, whatever object surfaces are intended to be engaged by the edge mating surfaces 15 of the tool 10 are assumed for the purposes of this invention to be edge surfaces of the object. The illustrated embodiment of the tool 10 was intended for use with an object having a thickness that is much less than any dimensions of the top or bottom surfaces, however the use of the tool 10 is not limited for use with only these or similar dimensional relationships.

Note that the opening 12 need not have rounded corners as shown in FIG. 2, but could have squared corners as shown in FIG. 3A. Alternatively, and by example only, the opening 12 could be provided as a number of smaller square or slotted or round openings as shown in FIGS. 3B and 3C.

The use of the die edge picking tool 10 assumes that a proper seal or mating of tool edge(s)-to-die edge(s) is obtained. In this regard it has been found to be desirable that the width and or length of the vacuum opening 12 not be larger than the dimensions of the die edge 20A, 20B to prevent vacuum leakage, as a large vacuum leak would create a small vacuum picking force, and vice versa. The quality of the seat or mating of the die edge picking tool 10 to the die edges 20A, 20B is directly correlated to the picking force. The width of the leg die edge mating surfaces (LW), shown most clearly in FIG. 2, may be greater than, equal to, or less than the thickness (T) of the die 20. Also, the length of the leg die edge mating surfaces (LL) may be greater than, equal to, or less than the length (L) and/or width (W) of the die 20, depending generally on how much picking force is desired or required to manipulate the die 20 in the desired fashion.

As shown in FIG. 4, the die edge mating surfaces of the legs 14A and 14B may be provided with a gasket 18 surrounding the opening 12 to improve the vacuum seal. The gasket 18 may be composed of any suitable material, such as an elastomeric material that is applied adhesively or by some other technique to the die edge mating surface 15 of a leg 14 so as to surround the opening 12. The need for the gasket 18 depends at least in part on the straightness and flatness of the legs 14A and 14B and the die 20 to be picked. A larger die edge picking tool 10 more easily facilitates the use of the gasket 18 than a smaller die edge picking tool. However, smaller die have less mass, and therefore require a lesser quality of the vacuum seal and a less strong picking force.

Exemplary dimensions of the die edge picking tool 10 in FIGS. 1 and 2, assuming die 20 dimensions (in inches): Length (L)=0.517, Width (W)=0.337, Thickness (T)=0.019, are a leg 14 length (LL) of 0.25, a leg 14 width (LW) of about 0.02, and the vacuum opening 12 has a length of 0.2 and a width of 0.005 (less than the thickness (T) of the die 20, as was explained above.) The width of the leg 14 (LW) may be any suitable value so long as it comfortably accommodates the width of the opening 12 and the presence of the gasket 18, if used. Assuming that the die 20 edges are perpendicular to one another, the legs 14A and 14B form a right angle and meet at a corner. In one preferred embodiment there are two leg 14 portions providing two mating surfaces that meet at the corner, where the corner defines a 90 degree angle and corresponds to a corner of the integrated circuit die 20. It is preferred, but not required, that a corner recess or relief 15A be provided so that the corner of the die 20 will fully fit within the corner of the tool 10 without obstruction, enabling the die edges to contact both legs 14 without interference from a die corner that may be slightly rounded due to manufacturing tolerances or imperfections.

The foregoing dimensions are of course not a limitation on the practice of this invention and, in general, the dimensions of the die edge picking tool 10 are governed by the dimensions of the die 20 that is desired to be picked as well as by the desired picking force. Furthermore, there is no requirement that the legs 14A and 14B have the same shape and/or length, or that the opening(s) 12 in leg 14A have the same dimensions and/or the same shape as the opening(s) 12 in the leg 14B.

The vacuum supply to the die edge picking tool 10 may vary in flow rate, which directly correlates to the picking force. However, it may be desirable to use the highest flow rate that is achievable with the selected vacuum supply system. It is also desirable for the internal vacuum flow region within the body portion 16 to have minimal flow restrictions and a large flow area. This increases the flow rate at the die-mating surface of the die edge picking tool 10, and ensures the largest amount of picking force.

The die edge picking tool 10 may be used in a manual or an automated fashion. In the manual mode the die edge picking tool 10 can replace the necessity of tweezers, thereby eliminating the damage that tweezers can inflict on the die 20, such as chipping or scratching. Utilized in an automated fashion the die edge picking tool 10 may be incorporated with a programmable (robotic manipulator) system for pick and placement of die for processing, inspection, grade segregation and other well known operations.

Figure 5A:
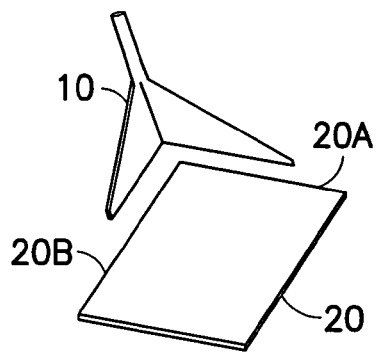
FIGS. 5A and 5B are two different isometric views showing the die edge picking tool approaching the edges of the die 20.
Figure 5B:
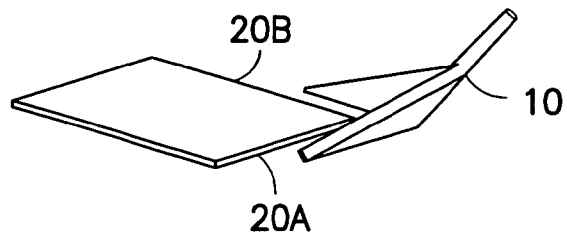
Figure 5C:
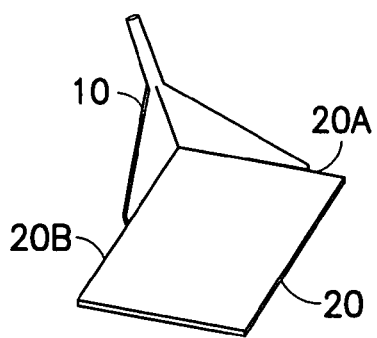
FIGS. 5C and 5D are two corresponding isometric views showing the die edge picking tool when vacuum-mated to the die edges.
Figure 5D:
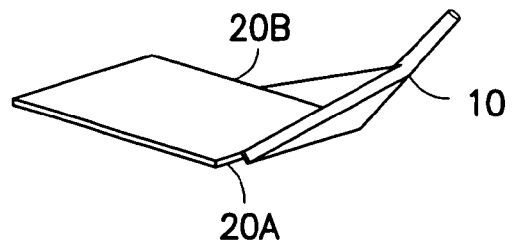

FIGS. 5A and 5B are two different isometric views showing the die edge picking tool 10 approaching the edges 20A and 20B of the die 20, which is assumed to be disposed on some surface, while FIGS. 5C and 5D are two corresponding isometric views showing the die edge picking tool 10 vacuum-mated to the die edges 20A and 20B along the die edge mating surfaces 15. At this point the die 20 can be lifted from the surface and manipulated in three dimensional space. The die 20 can be released from the die edge picking tool 10 by simply interrupting or reducing the vacuum supply. FIGS. 5A and 5B illustrate how the die edge picking tool 10 is gently butted up to the corner edges 20A and 20B of the die 20, and the vacuum supply is turned on (if not already on). Once the vacuum seal is made the die 20 can be picked up.

Figure 6B:
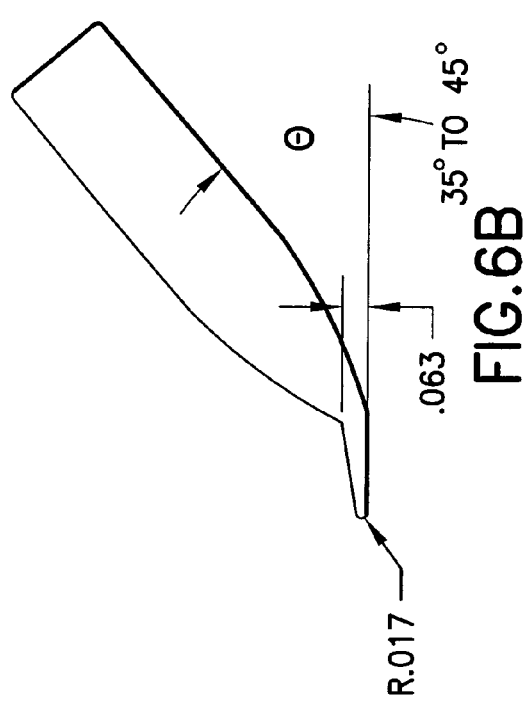
FIGS. 6A, 6B and 6C are front, side and top views, respectively, of an embodiment of the die edge picking tool showing exemplary dimensions and angular relationships.
Figure 6C:
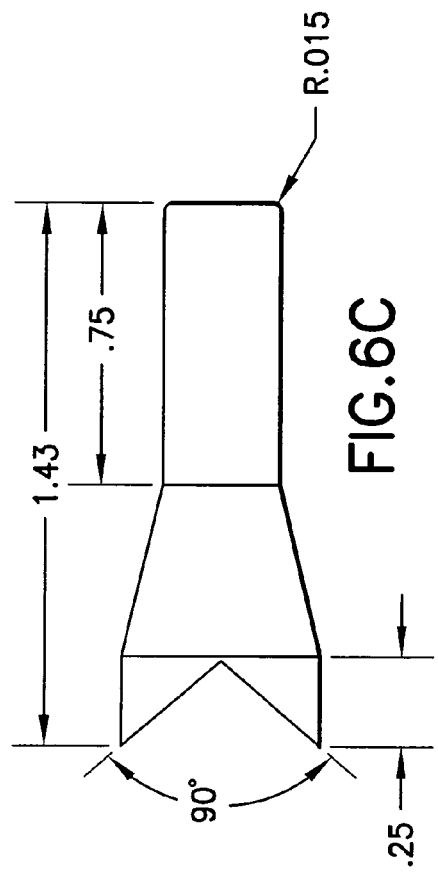
Figure 6A:
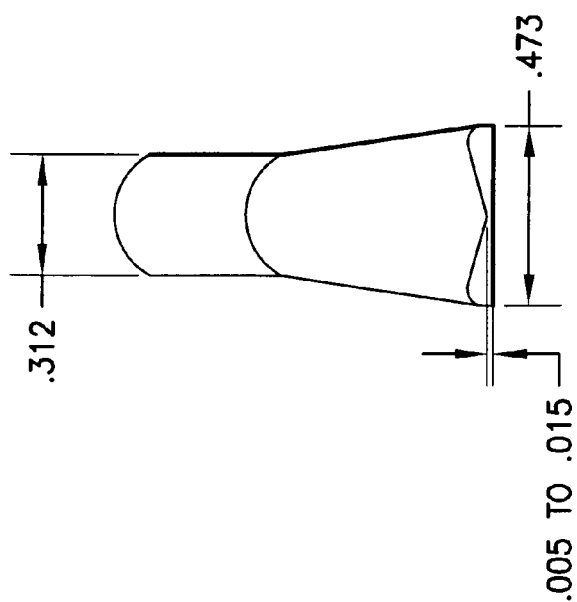

FIGS. 6A, 6B and 6C are front, side and top views, respectively, of an embodiment of the die edge picking tool 10, showing exemplary dimensions. Note that the angle theta in FIG. 6B may be any suitable value, up to 90 degrees.

Figure 7A:
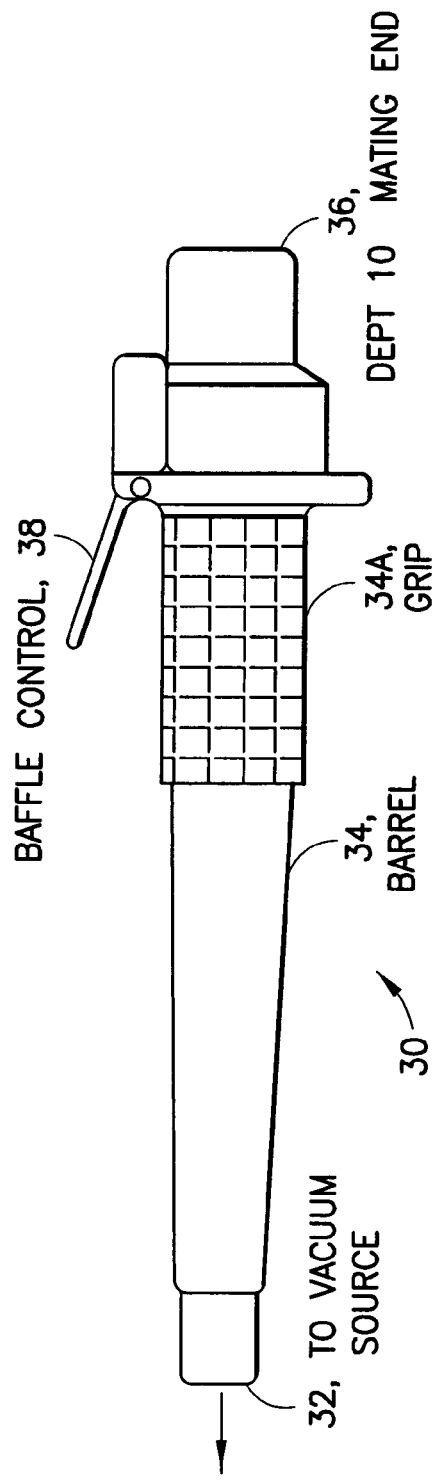
FIGS. 7A and 7B are a side and an end-on view, respectively, of an embodiment of a hand tool suitable for use with the die edge picking tool of this invention.
Figure 7B:
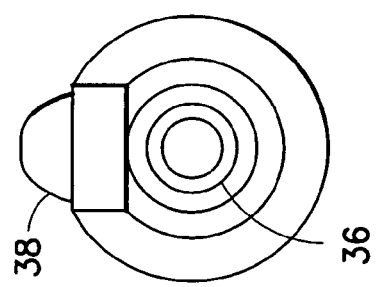

FIGS. 7A and 7B are a side and an end-on view, respectively, of an embodiment of a hand tool 30 suitable for use with the die edge picking tool 10. The hand tool 30 has a first end 32 for connection to the vacuum source, a barrel 34 that includes a textured grip 34A, a die edge picking tool mating end 36 for engaging the body portion 16 of the die edge picking tool (e.g., by a friction fit or a threaded connection), and an optional baffle control 38 lever or switch for controlling the position of an internal baffle (not shown) located in the fluid path between ends 32 and 36. By using the baffle control 38 the user is enabled to control the strength of the vacuum and thus the picking force. By closing the baffle the vacuum is interrupted and the die can be released from the die edge picking tool 10. A foot pedal activated vacuum source could be provided as well. This embodiment of the hand tool 30 is illustrative of only one suitable design for coupling the vacuum source to the tool 10, and other suitable designs may be used as well.

The manufacturing of the die edge picking tool 10 may be by any of a number of methods, and is preferably based on the desired feature sizes of the die 20. For example, and assuming the dimensions shown in FIGS. 1 and 2, it was determined that the vacuum groove opening 12 could be machined as small as 0.005" wide. However, other techniques may be utilized to achieve a small groove size. For example, the die edge picking tool 10 could be manufactured as more than one piece, and the pieces could then be joined together adhesively or by some other suitable technique. Alternately one may press-form sheet metal or tubing into the proper configuration. The die edge picking tool 10 could be made from metal, plastic, ceramic or combinations of these materials. The foregoing manufacturing techniques are not inclusive, but are merely exemplary of possible alternatives for manufacturing the die edge picking tool 10.

It should be appreciated that this invention provides several unique features and considerations. These include an ability to perform vacuum picking at the edges of the die 20, as opposed to engaging the top, circuitry-containing surface of the die 20, and an ability to provide variations on sealing (e.g., the use or non-use of the gasket 18 as well as variations in the size of the die edge picking tool 10.)

Figure 8:
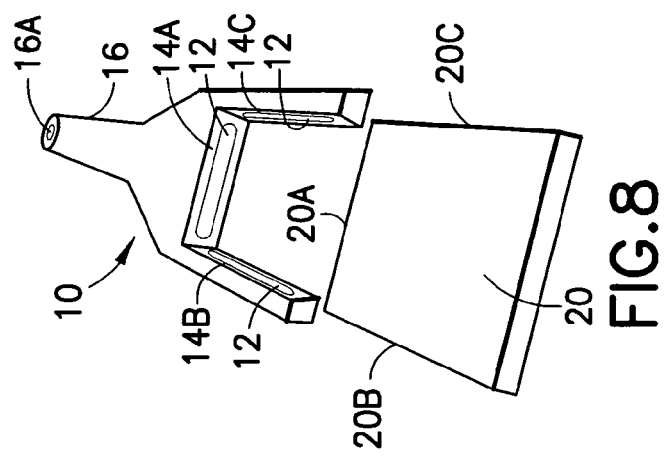
FIG. 8 shows an embodiment of the die edge picking tool having three legs for engaging a die along three edges.

It should further be appreciated that the number of legs 14 can be varied. As an example, FIG. 8 shows an embodiment of the die edge picking tool 10 having three legs (14A, 14B, 14C) for engaging the die 20 on three edges (20A, 20B, 20C). This embodiment does, however, require that the dimensions of the die 20 be accurately known and controlled. Note, however, that in this embodiment the vacuum seal along edges 20B and 20C could be made less strong than the vacuum seal along the edge 20A, and the vacuum seal along edges 20B and 20C may be employed primarily to resist the cantilever effect that was mentioned above, with the primary vacuum holding force being provided through the leg 14A along the die edge 20A. In this case the dimensional accuracy can be relaxed somewhat, as the legs 14B and 14C may not need to seal as tightly as the leg 14A.

It can be appreciated that the die edge picking tool 10 provides a number of advantages over the prior art die picking tools, and yet is very simple to construct and operate. For example, it can be of a unitary one-piece construction that requires only a vacuum source for operation, and yet the use of the die edge picking tool 10 avoids any requirement to physically contact other than the edges of the integrated circuit die 20.

Furthermore, these teachings are not limited for use with only semiconductor die, as other objects may be engaged by their edges and manipulated in the same manner. In this case, and if the overall shape of the object is non-square or non-rectangular, then the shape of the legs of the edge picking tool 10 can be varied as well.

Thus, while described above in the context of certain shapes, dimensions, numbers of legs and so forth, all of these specific parameters should be viewed as exemplary, and in no way as imposing limitations on the practice of this invention. As such, and while the teachings in accordance with this invention have been particularly shown and described with respect to preferred embodiments thereof, it will be understood by those skilled in the art that changes in form and details may be made therein without departing from the scope of this invention.

What is claimed is:

1. A tool of monolithic form for vacuum-holding an object, comprising a body portion comprising a vacuum outlet for being coupled to a vacuum source, said body portion being coupled to a plurality of tool leg portions each comprising an edge defining a mating surface for engaging a different edge surface of the same object, each mating surface comprising at least one vacuum inlet in fluid communication with said vacuum outlet; and wherein there are two leg portions providing two mating surfaces that meet at a corner.

2. A tool as in claim 1, where the corner defines a 90 degree angle.

3. A tool as in claim 1, where said object is a semiconductor circuit die.

4. A tool for vacuum-holding an object, comprising a body portion comprising a vacuum outlet for being coupled to a vacuum source, said body portion being coupled to a plurality of tool leg portions each comprising an edge defining a mating surface for engaging an edge of the object, each mating surface comprising at least one vacuum inlet in fluid communication with said vacuum outlet, further comprising a gasket surrounding said at least one vacuum inlet.

5. A tool for vacuum-holding an object, comprising a body portion comprising a vacuum outlet for being coupled to a vacuum source, said body portion being coupled to a plurality of tool leg portions each comprising an edge defining a mating surface for engaging an edge of the object, each mating surface comprising at least one vacuum inlet in fluid communication with said vacuum outlet, where there are at least two leg portions each providing a mating surface that meet at a corner, and further comprising a corner relief.

6. A tool of monolithic form for vacuum-picking a semiconductor circuit die, comprising a body portion comprising a vacuum outlet for being coupled to a vacuum source, said body portion being coupled to at least two tool leg portions each comprising an edge surface defining a mating surface for engaging an edge of the die, said edge surfaces meeting at a corner, each mating surface comprising at least one vacuum inlet in fluid communication with said vacuum outlet.

7. A tool as in claim 6, where said vacuum inlet is comprised of an opening having dimensions that are less than dimensions of the edge of the die.

8. A tool as in claim 6, where said vacuum inlet is comprised of an opening having at least one dimension that is less than dimensions of the edge of the die.

9. A tool as in claim 6, where said vacuum inlet is comprised of an elongated slot having dimensions that are less than dimensions of the edge of the die.

10. A tool for vacuum-picking a semiconductor circuit die, comprising a body portion comprising a vacuum outlet for being coupled to a vacuum source, said body portion being coupled to at least two tool leg portions, each comprising an edge surface defining a mating surface for engaging an edge of the die, said edge surfaces meeting at a corner, each mating surface comprising at least one vacuum inlet in fluid communication with said vacuum outlet, further comprising a gasket surrounding said at least one vacuum inlet.

11. A tool for vacuum-picking a semiconductor circuit die, comprising a body portion comprising a vacuum outlet for being coupled to a vacuum source, said body portion being coupled to at least two tool leg portions, each comprising an edge surface defining a mating surface for engaging an edge of the die, said edge surfaces meeting at a corner, each mating surface comprising at least one vacuum inlet in fluid communication with said vacuum outlets where said vacuum outlet is adapted to be coupled to a hand-held tool that is interposed between said vacuum outlet and the vacuum source.

12. A tool for vacuum-picking a semiconductor circuit die, comprising a body portion comprising a vacuum outlet for being coupled to a vacuum source, said body portion being coupled to at least two tool leg portions each comprising an edge surface defining a mating surface for engaging an edge of the die, said edge surfaces meeting at a corner, each mating surface comprising at least one vacuum inlet in fluid communication with said vacuum outlet, further comprising a corner relief.

13. A method for picking a semiconductor circuit die that is disposed on a surface, comprising:
  engaging the die at a corner thereof with a vacuum-picking tool;
  applying a vacuum holding force from the tool only along edges of the die that meet at the corner; and
  lifting the die from the surface with the tool without intentionally contacting a top surface of the die.

14. A tool for vacuum-picking a semiconductor circuit die that is disposed on a surface, comprising:
  means for engaging the die at a corner thereof with the vacuum-picking tool; and
  means for applying a vacuum holding force from the tool only along edges of the die that meet at the corner, the vacuum holding force being sufficient to hold the die while the die is lifted from the surface with the tool.

15. A tool as in claim 14, where the die is lifted from the surface without intentionally contacting a top surface of the die.

* * * * *